United States Patent [19]

Davis et al.

[11] Patent Number: 4,766,399
[45] Date of Patent: Aug. 23, 1988

[54] OSCILLATOR CIRCUIT

[75] Inventors: John D. Davis, Beacon; Allan L. Mullgrav, Jr., Wappingers Falls, both of N.Y.

[73] Assignee: International Business Machines Corporation, Armonk, N.Y.

[21] Appl. No.: 81,058

[22] Filed: Aug. 3, 1987

[51] Int. Cl.$^4$ ............................................... H03K 3/26
[52] U.S. Cl. ........................................ 331/111; 331/143
[58] Field of Search .............. 331/108 R, 108 C, 111, 331/143; 307/261, 544; 328/13; 368/159

[56] References Cited

U.S. PATENT DOCUMENTS 4,122,414  10/1978  Patterson, III ................. 331/111 X Primary Examiner—Eugene R. LaRoche
Assistant Examiner—Robert J. Pascal
Attorney, Agent, or Firm—William T. Ellis

[57] ABSTRACT

An oscillator with noise rejection and a fifty percent duty cycle for the on-chip generation and conversion of a sine wave to a square wave, using an external reference crystal. The circuit comprises a low gain current switch including a first and second switching transistors, with the control lines of the switching transistors connected to a reference voltage line. The reference crystal is connected across the control input and the current receiving terminals of the first transistor so that a square wave is obtained at the current receiving terminal of the second transistor. A threshold circuit is included for adjusting the voltage of the square wave signal from the second transistor and applying the adjusted signal to a diode-coupled receiver circuit, which provides the output for the circuit. This oscillator circuit provides a double action noise immunity through the use of a low gain current switch to prevent noise amplification, in combination with a diode-coupled receiver which is affected by noise only during signal transitions. A duty cycle very close to fifty percent is realized by the circuit.

5 Claims, 1 Drawing Sheet

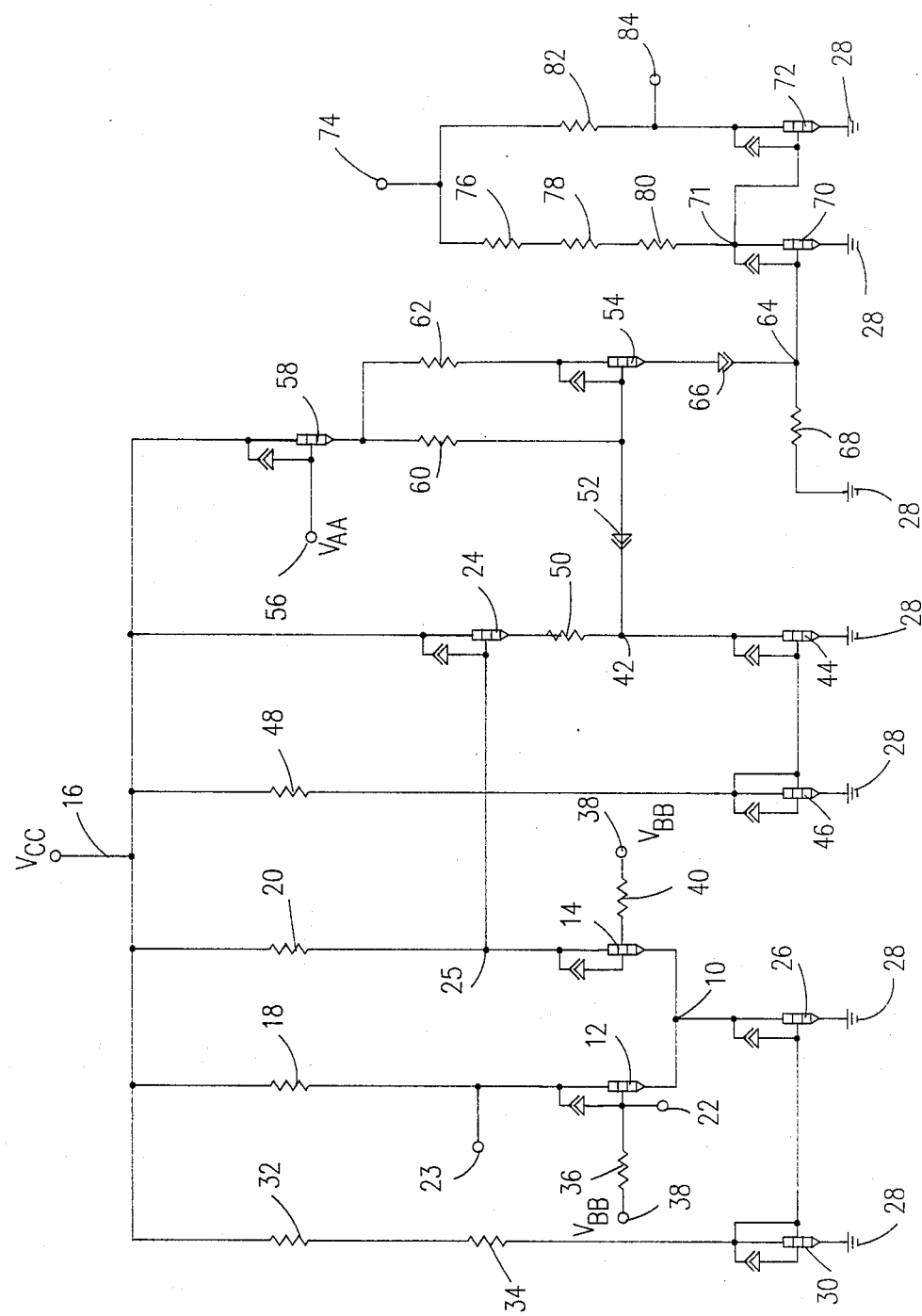

OSCILLATOR CIRCUIT

DESCRIPTION

Background of the Invention

The present invention relates generally to electronic oscillators, and in particular to electronic oscillator circuits formed in gate array cells.

A clock signal is required for many semiconductor chips on which digital logic is performed. An oscillator circuit generates a sine wave using an external (off-chip) reference, such as a quartz crystal, and converts it to a square wave. This square wave is then used as a clock signal for the on-chip circuits. However, prior art oscillator circuits suffer from significant signal-to-noise degradation due to noise injection at the points where the external reference is applied to the chip.

In a typical oscillator configuration, the lines from an external crystal are connected across a common-emitter-connected first stage amplifier. This stage operates to significantly amplify the injected noise, along with the sine wave. In many systems applications the signal-to-noise ratio resulting from such noise amplification is unacceptable. Attempts have been made to address this noise injection problem. But such attempts generally trade-off duty cycle for noise immunity. However, a good noise and duty cycle characteristic is critical for clocking applications for high speed computing.

The invention as claimed is specifically directed to obtaining a low noise characteristic in combination with a fifty percent duty cycle characteristic.

SUMMARY OF THE INVENTION

Briefly, the present invention comprises an oscillator with noise rejection and a fifty percent duty cycle, comprising:

a low gain current switch circuit including a first and second switching transistors, with a reference voltage connected to the control inputs of the first and second transistors;

a reference crystal directed across the control input and the current receiving terminal of the first transistor so that a square wave is obtained at the current receiving terminal of the second transistor;

a diode-coupled receiver circuit with an input node and an output node; and a threshold circuit for adjusting the voltage of the square wave signal from the second transistor and applying the adjusted signal to the input node of the diode-coupled receiver, wherein a low noise square wave is obtained at the receiver output with essentially a fifty percent duty cycle.

In a preferred embodiment, a current switch circuit is connected to a first power supply line at a first voltage; and wherein the diode-coupled receiver circuit comprises
a third transistor;
a diode coupling the output of the threshold-adjust circuit to the control input of the third transistor;
a second power supply line at a second different voltage;
means connected to the second power supply line for providing a constant voltage;
a first resistor network for providing current from the constant voltage means to the anode of the diode and to the current-receiving terminal of the third transistor;

a first inverter circuit with its input connected to the current-emitting terminal of the third transistor;
a second inverter circuit with its input connected to the output of a first inverter circuit, and with its output comprising the output node; and
a third power supply line at a third voltage different from the first and second voltages for powering the first and second inverter circuits.

BRIEF DESCRIPTION OF THE DRAWING

The FIGURE is a schematic circuit diagram of a preferred embodiment of the present invention.

DETAILED DESCRIPTION OF THE PREFERRED EMBODIMENT

The present invention will be illustrated and explained in the context of bipolar transistors. However, it should be clear to one skilled in the art that a variety of other switching devices may be utilized in substitution for the bipolar transistors. With respect to terminology, the current receiving terminal of the transistor is meant to refer to that terminal of the transistor which receives current, i.e., the collector for the bipolar transistor, or the drain for the field effect transistor. Likewise, the current emitting terminal is meant to refer to that terminal of the transistor which emits current, i.e., the emitter for the bipolar transistor or the source for the field effect transistor.

Referring now to the FIGURE, the invention, in one embodiment, comprises a first node 10, a first transistor 12 with its current emitting terminal connected to the first node, and a second transistor 14 with its current emitting terminal connected to the first node. The circuit further comprises a first power supply line 16, a first resistor 18 connected between the first power supply line 16 and the current receiving terminal 23 of the first transistor 12. A second resistor 20 is connected between the first power supply line 16 and the current receiving terminal 25 of the second transistor 14. A reference, for example, a quartz crystal, is connected between the current receiving terminal 23 and the control input terminal 22 of the first transistor 12, with appropriate load capacitance provided from each of the terminals 23 and 25 to ground potential. A third transistor 24 is disposed with its current receiving terminal connected to the first power supply line 16 and with its control input connected to the current receiving terminal 25 of the second transistor 14. A fourth transistor 26 is disposed with its current receiving terminal connected to the first node 10 and with its current emitting terminal connected to a second power supply line 28, which may for example, be ground voltage. A first constant voltage source is provided for biasing the control line of the fourth transistor 26. In the embodiment shown in the FIGURE, the first constant voltage source comprises a diode 30 (a transistor with its collector and base shorted) and resistors 32 and 34 connected in series between the first power supply line 16 and the anode of the diode 30. The voltage drop across diode 30 provides a constant voltage at the control line of the fourth transistor 26.

It can be seen that the first and second transistors 12 and 14 are connected as the switching transistors for a current switch. The fourth transistor 26 operates as a current source for the current switch. The first transistor 12 has its control line connected through a resistor 36 to a first reference voltage line 38. Likewise, the second transistor 14 has its control line connected through a resistor 40 to the first reference voltage line 38. The transistors 12 and 14 and the load resistors 18 and 20 are specifically chosen in order to provide the current switch circuit with a very low voltage gain of on the order of 1.0 at terminal 23. In particular, the voltage gains between the terminals 22 and 23 and between the terminals 22 and 25 are maintained at a low level. This level is just enough to assure oscillation, so that the amplitude of the sine wave generated at the terminal 22 is large enough to produce an appropriate square wave at the terminal 25, while minimizing the amplification of any noise injected at the terminal 22 or the terminal 23.

The circuit further comprises a second node 42, and a fifth transistor 44 with its current receiving terminal connected to the second node 42 and with its current emitting terminal connected to the second power supply line 28. A second constant voltage source is provided for biasing the control line of the fifth transistor 44. In the embodiment shown in the FIGURE, the second constant voltage source comprises a diode 46 (a transistor with its collector shorted to its base) and a resistor 48. The diode 46 is disposed with its cathode connected to the second power supply line 28, and with its anode connected to one end of the resistor 48. The other end of the resistor 48 is connected to the power supply line 16. The constant voltage drop across diode 46 provides a constant voltage to bias the control line for transistor 44.

A third resistor 50 is connected between the current emitting terminal of the third transistor 24 and the second node 42. A first diode 52 is disposed with its cathode connected to the second node 42. A sixth transistor 54 is disposed with its control line connected to the anode of the first diode 52. A second reference voltage line 56 is provided with a voltage which is different from the first and second power supply line voltages and the first reference voltage line. A voltage source transistor 58 is disposed with its control line connected to the second reference voltage line and with its current receiving terminal connected to the power supply line 16. A first resistor network is disposed for providing current from the voltage source transistor 58 to the current receiving terminal of the sixth transistor 54 and to the anode of the first diode 52. In the embodiment shown in the FIGURE, this first resistor network comprises a resistor 60 connected from the current emitting terminal of the transistor 58 to the anode of the first diode 52, and a resistor 62 connected from the current emitting terminal of transistor 58 to the current receiving terminal of transistor 54.

The circuit further comprises a third node 64, and a second diode 66 with its cathode connected to the third node 64 and with its anode connected to the current emitting terminal of transistor 54. A fourth resistor 68 is connected between the third node 64 and the second voltage reference line 28. A seventh transistor 70 is disposed with its control line connected to the third node 64 and with its current emitting terminal connected to the second voltage reference line 28. An eighth transistor 72 is disposed with its control line connected to the current receiving terminal of the seventh transistor 70, and with its current emitting terminal connected to the second power supply line 28. The output terminal 84 for the oscillator is connected to the current receiving terminal for the eighth transistor 72. A third reference voltage line 74 with a voltage which is different from the first and second power supply lines and the second reference voltage lines is provided for powering the seventh and eighth transistors 70 and 72, respectively. A second resistor network is included for providing power from the third reference voltage line 74 to the current receiving terminals of the seventh transistor 70 and the eighth transistor 72. In the embodiment shown in the FIGURE, this second resistor network comprises the resistors 76, 78, and 80, connected in series, with one end of the series connection connected to the third reference voltage line 74, and with the other end of the series connection connected to the current receiving terminal of the seventh transistor 70. The second resistor network further includes a resistor 82 which is connected between the third reference voltage line 74, and the current receiving terminal of the eighth transistor 72.

In a preferred embodiment of the present invention, the first and the third reference voltage lines are at the same voltage level. Additionally, the diodes 52 and 66 may be implemented conveniently by means of Schottky barrier diodes. Additionally, it is desirable for many applications to connect a diode such as a Schottky barrier diode across the base and collector terminals of all of the transistors in order to prevent transistor saturation.

It can be seen that the transistors 24, 44, the resistors 50 and 48, and the diode 46 operate as a level shifting and threshold adjusting circuit for the square wave signal obtained from the terminal 25. In particular, the waveform at the second node 42 is a nearly-square trapezoidal function, whose midpoint can be adjusted to coincide with a desired threshold voltage by adjusting the value of the third resistor 50. The voltage drop across the third resistor 50 controls the voltage at the second node 42. In essence, the node 42 voltage tracks the voltage at the current-emitting terminal of the third transistor 24, with a prescribed voltage drop therebetween set by the drop across the resistor 50. This resistor adjustment can be used to compensate for duty cycle skews of subsequent circuits attached to the oscillator (such as an output driver) so that the overall duty cycle remains approximately 50%.

It should be noted that the circuitry to the right of the second node 42 is very similar to a diode coupled receiver with a direct-coupled inverter at its output. This circuit functions to convert the voltage at the second node 42 to the levels required by the internal circuits of the logic gate array. It should be noted that the noise immunity for the overall circuit is enhanced by this receiver-type output because only noise that occurs during the rapid transition through the threshold region can be propagated to the output of the circuit. This enhanced noise rejection may be understood as follows. If the output terminal 84 is either at a high or a low voltage, then any injected noise present at the terminal 25 will not be able to switch that output voltage level. It is only at the point where the voltage level of the second node 42 is just high enough to reverse bias the diode 52 and to turn on the sixth transistor 54, that any noise present at the terminal 25 could have an effect in switching the transistor 54 on or off. However, note again that amplitude of any noise present at the terminal 25 will be low because of the low gain of the current switch circuit.

The diode-coupled receiver operates as follows. When the second node 42 is at a low voltage, then the diode 52 is biased into conduction and current flows from the constant voltage source transistor 58 through the resistor 60, through the diode 52, and through the fifth transistor 44 to the reference potential 28. No current flowing through the resistor 60 flows toward the control input of the transistor 54. The low voltage at the cathode of the diode 52 is coupled to the control line of the transistor 54, maintaining that transistor in non-conduction. With the sixth transistor 54 being in a non-conductive state, voltage at the third node 64 remains low and the seventh transistor 70, which has its control line connected to the third node 64, is biased into non-conduction. The current receiving terminal 71 of the seventh transistor 70 is thus at a high potential, so that the eighth transistor 72, with its control line connected to that terminal, is biased into conduction. The transistor 72 thus draws current through the resistor 82 resulting in a voltage drop or low voltage at the output terminal 84.

When the second node 42 rises to a high voltage, the diode 52 is reverse biased. Accordingly, the current drawn through the resistor 60 is applied to the control input of the sixth transistor 54 and the voltage at the control input rises so that the transistor 54 begins to conduct. Current flowing through the transistor 54 flows through the resistor 68 and provides a voltage drop thereacross, thereby increasing the voltage at the third node 64. This voltage increase in combination with the current flow into the control line of the seventh transistor 70 brings that transistor into conduction. Transistor 70 thus draws current through the resistor 76, 78, and 80, with a resulting voltage drop at the node 71. This voltage drop at the node 71 is sufficient to bias the eighth transistor 72 into non-conduction. With no current flowing through the resistor 82, the voltage at the output terminal 84 rises to a high level.

It should be noted that the use of a constant voltage source 58 connected to the reference line voltage 56 allows the resistors 60 and 62 to connect to a lower voltage, than the power supply line 16. If the resistors 60 and 62 were connected directly to the power supply line 16, then they would have to be larger to provide the same current to the sixth transistor 54. However, these larger resistors in combination with the capacitances at the control line and the current receiving terminals for the transistor 54 would provide larger RC time constants, resulting in slower switching operation for the circuit.

The present oscillator circuit provides a square wave with close to a fifty percent duty cycle while maintaining high noise immunity. The circuit features a double noise immunity by connecting an external reference across a low gain current switch, and by utilizing a diode-coupled receiver circuit which is affected by noise only during the rapid transitions through the threshold region of the square wave. The circuit further features a threshold circuit for adjusting the voltage of the square wave signal and applying the adjusted signal voltage to the input of the diode-coupled receiver. Finally, this circuit eliminates the need for the common-emitter-connected first stage amplifier with its attendant noise amplification problem.

While the present invention has been particularly shown and described with reference to preferred embodiments therefor, it will be understood by those skilled in the art that the foregoing and other changes in form and detail may be made therein without departing from the spirit and the scope of the present invention, as defined in the appended claims.

We claim:

1. An oscillator with noise rejection and a fifty percent duty cycle, comprising:
   a first reference voltage line at a first voltage;
   a low gain current switch circuit including a first and second switching transistors, with the control lines of said first and second transistors connected to said first reference voltage line;
   a reference connected across the control input and the current receiving terminal of said first transistor so that a square wave is obtained at the current-receiving terminal of said second transistor;
   a diode-coupled receiver circuit with an input node and an output node; and
   a threshold circuit for adjusting the voltage of said square wave signal from said second transistor and applying said adjusted signal to the input node of said diode-coupled receiver, wherein a low noise square wave is obtained at said receiver output node with essentially a fifty percent duty cycle.

2. An oscillator as defined in claim 1 wherein said current switch circuit is connected to a power supply line at a second voltage; and
   wherein said diode-coupled receiver circuit comprises
   a third transistor;
   a diode coupling the output of said threshold-adjust circuit to the control input of said third transistor;
   a second reference voltage source at a third voltage different from said first and second voltages;
   means connected to said second reference voltage source for providing a constant voltage;
   a first resistor network for providing current from said constant voltage means; to the anode of said diode and to the current receiving terminal of said third transistor;
   a first inverter circuit with its input connected to the current-emitting terminal of said third transistor;
   a second inverter circuit with its input connected to the output of said first inverter circuit, and with its output comprising said output node;
   a third reference voltage line at a fourth voltage different from said second and third voltages; and
   a second resistor network for powering said first and second inverter circuits.

3. An oscillator as defined in claim 2, wherein said first and fourth voltages are equal.

4. An oscillator as defined in claim 1, wherein the gain for said current switch circuit is on the range order of 1.0 at the inverting output.

5. A low gain current switch circuit including
   a first node;
   a first reference voltage line;
   a first transistor with its current-emitting terminal connected to said first node and its control line connected to said first reference voltage line;
   a second transistor with its current-emitting terminal connected to said first node and with its control line connected to a said first reference voltage line;
   a power supply line at a voltage different from said first reference voltage line;
   a first resistor connected between the power supply line and the current-receiving terminal of said first transistor;
   a second resistor connected between said power supply line and the current-receiving terminal of said second transistor;

a reference crystal connected between the current-receiving terminal and the control terminal of said first transistor;

a third transistor with its current receiving-terminal connected to said first power supply and with its control input connected to the current-receiving input of said second transistor;

a second power supply line at a voltage different from said first reference voltage line and said first power supply line;

a fourth transistor with its current-receiving terminal connected to said first node and with its current emitting terminal connected to said second power supply line;

a first constant voltage source for biasing the control line of said fourth transistor;

a second node;

a fifth transistor with its current-receiving terminal connected to said second node and its current-emitting terminal connected to said second reference voltage line;

a second constant voltage source for biasing the control line of said fifth transistor;

a third resistor connected between said current emitting terminal of said third transistor and said second node;

a first diode with its cathode connected to said second node;

a sixth transistor with its control line connected to the anode of said first diode;

a second reference voltage line with a voltage different from said first and second power supply lines and said first reference voltage line;

a voltage source transistor with its control input connected to said second reference voltage line and with its current receiving terminal connected to said first power supply line;

a first resistor network for providing current from said voltage source transistor to the current-receiving terminal of said sixth transistor and to the anode of said first diode;

a third node;

a second diode with its cathode connected to said third node and its anode connected to the current-emitting terminal of said sixth transistor;

a fourth resistor connected between said third node and said second power supply line;

a seventh transistor with its control line connected to said third node and its current emitting terminal connected to said second power supply line;

an eighth transistor with its control line connected to the current receiving terminal of said seventh transistor and with its current emitting terminal connected to said second power supply line, and with an output terminal for said oscillator connected to its current receiving terminal; and a second resistor network for providing power from said first reference voltage line to said current receiving terminals of said seventh and eighth transistors.

* * * * *